US009590072B1

(12) United States Patent
Chou (10) Patent No.: US 9,590,072 B1
(45) Date of Patent: Mar. 7, 2017

(54) METHOD OF FORMING SEMICONDUCTOR DEVICE

(71) Applicant: UNITED MICROELECTRONICS CORP., Hsin-Chu (TW)

(72) Inventor: Ling-Chun Chou, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/990,806

(22) Filed: Jan. 8, 2016

(51) Int. Cl.
*H01L 29/66* (2006.01)
*H01L 21/8238* (2006.01)

(52) U.S. Cl.
CPC .......... *H01L 29/66537* (2013.01); *H01L 21/823807* (2013.01); *H01L 21/823821* (2013.01); *H01L 21/823842* (2013.01); *H01L 21/823878* (2013.01); *H01L 29/66545* (2013.01)

(58) Field of Classification Search
CPC ......... H01L 29/66545; H01L 29/66795; H01L 29/785; H01L 21/823821; H01L 21/823431
See application file for complete search history.

(56) References Cited

U.S. PATENT DOCUMENTS

| 5,444,003 A | 8/1995 | Wang et al. |
|---|---|---|
| 7,855,110 B2 | 12/2010 | Ontalus et al. |
| 2013/0200470 A1* | 8/2013 | Liu et al. .......... H01L 29/66795 257/408 |

\* cited by examiner

*Primary Examiner* — Tony Tran
(74) *Attorney, Agent, or Firm* — Winston Hsu; Scott Margo (57) ABSTRACT

The present invention provides a method of forming a semiconductor device including following steps. Firstly, a fin shaped structure is formed on a substrate, and a gate structure is formed to be across the fin shaped structure. Next, a dielectric layer is formed on the substrate, covering the gate structure, and a gate electrode of the gate structure is removed, to form a first gate trench. Then, a threshold voltage implantation process and a compensated threshold voltage implantation process are sequentially performed in the first gate trench, to implant compensated two dopants respectively. Following these, a work function layer and a conductive layer are formed to fill the first gate trench.

12 Claims, 9 Drawing Sheets

METHOD OF FORMING SEMICONDUCTOR DEVICE

BACKGROUND OF THE INVENTION

1. Field of the Invention

The invention relates to a semiconductor process of forming a semiconductor device having metal gate structures with different threshold voltages, and more specifically to a semiconductor process of forming a semiconductor device having metal gate structures with different threshold voltages by applying stacked work function layers and performing different threshold voltage implantation processes.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-k gate dielectric layer are used to replace the conventional poly-silicon gate to be the control electrode.

Also, with the trend in the industry being towards scaling down the size of the metal oxide semiconductor transistors (MOS), three-dimensional or non-planar transistor technology, such as fin field effect transistor technology (FinFET) has been developed to replace planar MOS transistors. Typically, threshold voltage in conventional planar metal gate transistors is adjusted by the means of ion implantation. Nevertheless, threshold voltages in current FinFETs cannot be easily adjusted by using ion implantation. Hence, how to resolve this issue in today's FinFET architecture has become an important task in this field.

SUMMARY OF THE INVENTION

It is one of the primary objectives of the present invention to provide a method of forming a semiconductor device having different threshold voltages, so that, the metal gate structures obtained thereto may be easy to meet the target threshold voltage ($V_{th}$).

To achieve the purpose described above, the present invention provides a method of forming a semiconductor device including following steps. First of all, a fin shaped structure is formed on a substrate, and a plurality of gate structures is formed to be across the fin shaped structure. Next, a dielectric layer is formed on the substrate, covering the gate structures, and gate electrodes of the gate structures are removed, to form a first gate trench, a second gate trench, a third gate trench and a fourth gate trench. Then, a first threshold voltage implantation process is performed in the first gate trench, to implant a first dopant in a first conductive type, and a compensated threshold voltage implantation process is performed in the first gate trench, to implant a second dopant in a second conductive type, wherein the second conductive type is opposite to the first conductive type. Following these, a first work function layer is formed in the fourth gate trench; and a second work function layer is formed in the first gate trench, the second gate trench and the third gate trench and on the first work function layer in the fourth gate trench, wherein the first work function layer and the second work function layer have a same conductive type.

To achieve the purpose described above, the present invention provides another method of forming a semiconductor device including following steps. First of all, a fin shaped structure is formed on a substrate, and a gate structure is formed to be across the fin shaped structure. Next, a dielectric layer is formed on the substrate, covering the gate structures, and a gate electrode of the gate structure is removed, to form a first gate trench. Then, a threshold voltage implantation process is performed in the first gate trench, to implant a first dopant in a first conductive type, and a compensated threshold voltage implantation process is performed in the first gate trench, to implant a second dopant in a second conductive type, wherein the second conductive type is opposite to the first conductive type. Following these, a work function layer is formed in the first gate trench, and a conductive layer is formed to fill the first gate trench.

According to the above, the method of the present invention is able to form a semiconductor device including various transistors with the same conductive type but in different threshold voltages. In the forming method of the present invention, a threshold voltage implantation process and a compensated threshold voltage implantation process are performed sequentially in the same transistor region, for lowering the threshold target thereof. Through this manner, the metal gate structures obtained in the present invention are easy to meet the target threshold voltages.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating a method of forming a semiconductor device according to a first preferred embodiment of the present invention, wherein:

FIG. 5 is a schematic diagram showing a semiconductor device according to the first preferred embodiment of the present invention.

FIG. 6 to FIG. 8 are schematic diagrams illustrating a method of forming a semiconductor device according to a second preferred embodiment of the present invention, wherein:

FIG. 8 is a schematic diagram showing a semiconductor device according to the second preferred embodiment of the present invention.

DETAILED DESCRIPTION

To provide a better understanding of the present invention, preferred embodiments will be described in detail. The preferred embodiments of the present invention are illustrated in the accompanying drawings with numbered elements.

Figure 1:
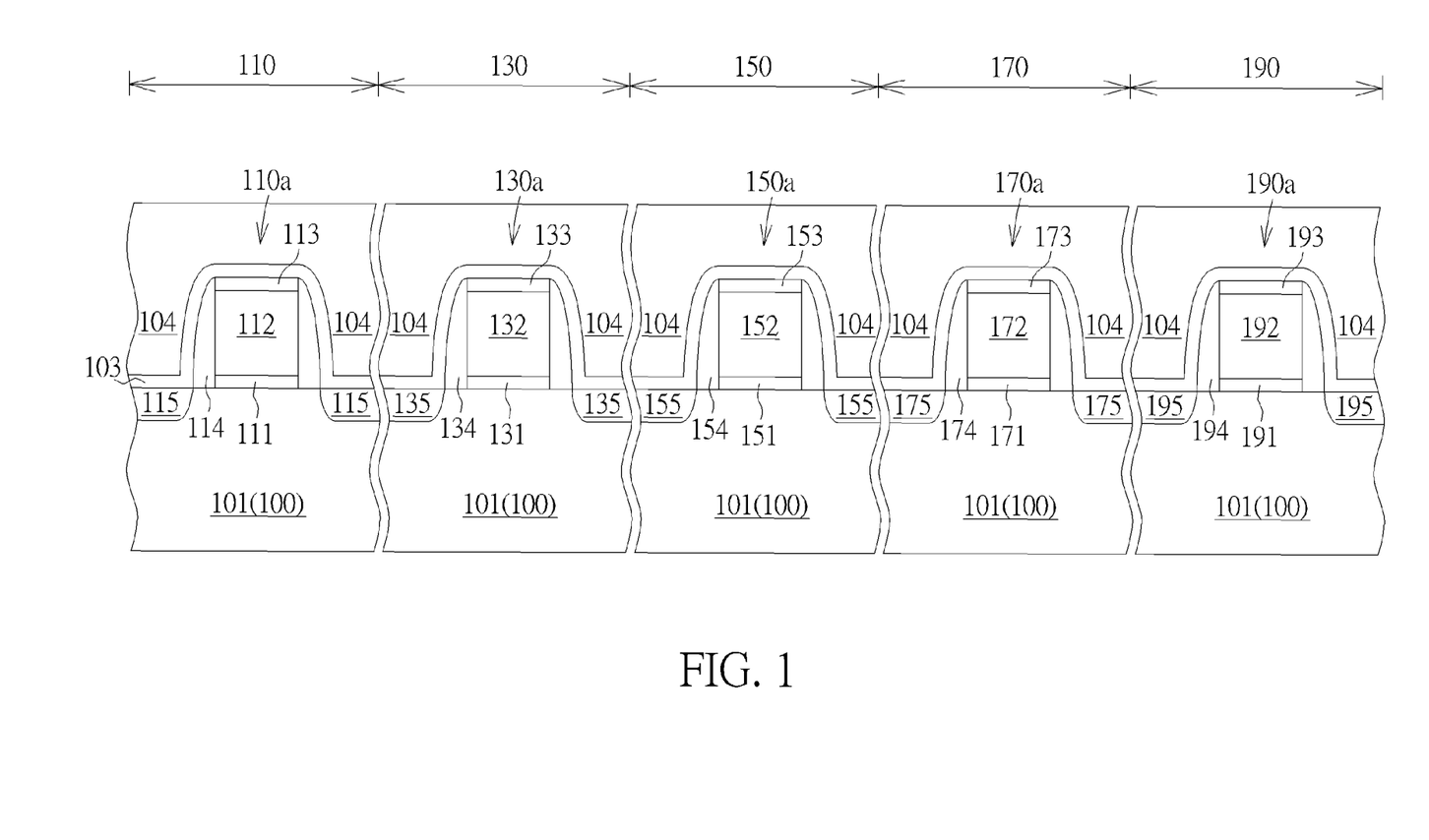
FIG. 1 is a schematic diagram showing a semiconductor device at the beginning of the forming process.

Please refer to FIG. 1 to FIG. 5, which are schematic diagrams illustrating a method of forming a semiconductor device according to the first preferred embodiment of the present invention. First of all, as shown in FIG. 1, a substrate 100 is provided. The substrate 100 for example includes a semiconductor substrate, such as a silicon substrate, a silicon-containing substrate or a silicon-on-insulator (SOI) substrate, but is not limited thereto. In one embodiment of the present invention, at least one fin shaped structure 101 may be formed in the substrate 100, for example through a self-aligned doubled patterning (SADP) process, and an insulating layer (not shown in the drawings), such as silicon oxide, is formed then to surround the fin shaped structure 101, so that, the insulating layer may perform like a shallow trench isolation (STI) thereby. However, in another embodiment, the fin shaped structure may also be omitted or may be formed through other forming processes.

Precisely, five transistor regions 110, 130, 150, 170, 190 are defined on the substrate 100. In a preferred embodiment of the present invention, the five transistor regions 110, 130, 150, 170, 190 preferably have channels in the same conductive type, for example all being NMOS regions, and the five transistor regions 110, 130, 150, 170, 190 are configured to fabricate gate structures having different threshold voltages ($V_{th}$) afterwards, but is not limited thereto.

Next, dummy gate structures 110a, 130a, 150a, 170a, 190a may be firstly formed on the substrate 100, preferably across the fin shaped structure 101. The dummy gate structures 110a, 130a, 150a, 170a, 190a include gate dielectric layers 111, 131, 151, 171, 191, such as silicon oxide or a high-k dielectric material; dummy gate electrodes 112, 132, 152, 172, 192, such as doped polysilicon material, undoped polysilicon material or amorphous silicon material; and capping layers 113, 133, 153, 173, 193, for example having monolayered or multilayered structures, respectively. In one embodiment, the formation of the dummy gate structures 110a, 130a, 150a, 170a, 190a may include sequentially forming an gate dielectric material layer (not shown in the drawings), a sacrificial gate material layer (not shown in the drawings) and a capping material layer (not shown in the drawings) stacked with each other from bottom to top on the substrate 100, and patterning those stacked layers and forming the dummy gate structures 110a, 130a, 150a, 170a, 190a shown in FIG. 1.

Then, spacers 114, 134, 154, 174, 194, for example having monolayered or multilayered structures, are formed respectively on sidewalls of the dummy gate structure 110a, 130a, 150a, 170a, 190a, wherein the spacers 114, 134, 154, 174, 194 may include high temperature oxide (HTO), silicon nitride, silicon oxide, silicon oxynitridd, or silicon nitride formed by hexachlorodisilane ($Si_2Cl_6$) (HCD-SiN), but is not limited thereto. Also, source/drain regions 115, 135, 155, 175, 195 are formed at two sides of the dummy gate structures 110a, 130a, 150a, 170a, 190a. After that, a contact etch stop layer (CESL) 103 and an interlayer dielectric layer (ILD) 104, such as a silicon oxide layer or a tetraethyl orthosilicate (TEOS) layer may be formed sequentially on the substrate 100, to cover the dummy gates structures 110a, 130a, 150a, 170a, 190a.

Figure 2:
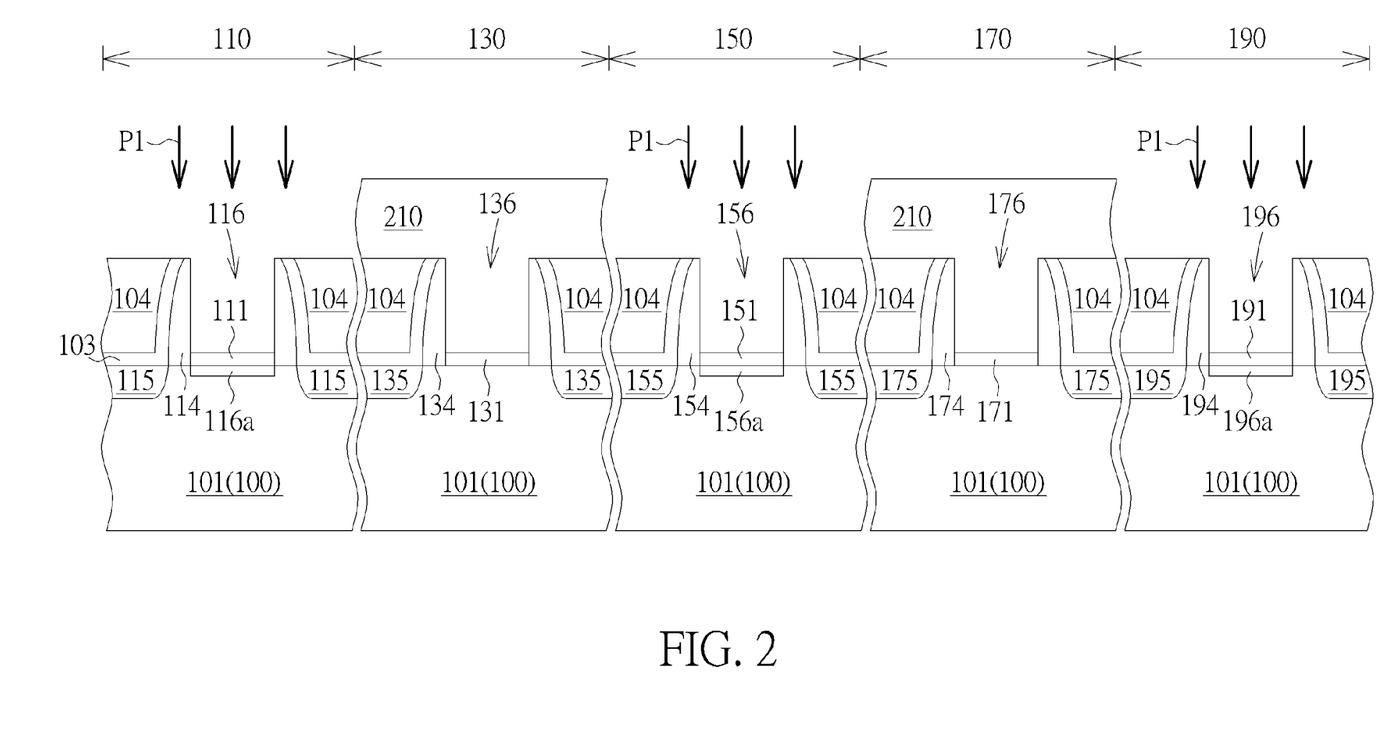
FIG. 2 is a schematic diagram showing a semiconductor device after performing the threshold voltage implantation process.

Following these, a replacement metal gate (RMG) process is performed and which may include performing a planarization process, such as a chemical mechanical planarization (CMP) process, to remove a portion of the ILD layer 104 and a portion of the CESL 103, till exposing top portions of the dummy gate electrodes 112, 132, 152, 172, 192, and performing an etching process, such as a dry etching process or a wet etching process, to remove the dummy gate electrodes 112, 132, 152, 172, 192. In one embodiment, the etching process may be performed by using an etchant, such as ammonium hydroxide ($NH_4OH$) or tetramethylammonium hydroxide (TMAH), so that, gate trenches 116, 135, 156, 176, 196 may be formed accordingly in the ILD layer 104 as shown in FIG. 2.

Then, a patterned mask layer, such as a patterned photoresist layer 210, may be formed to cover the transistor regions 130, 170, and a threshold voltage implantation process P1 is performed at the exposed gate trenches 116, 156, 196, to form doped regions 116a, 156a, 196a respectively in the transistor regions 110, 150, 190, through the patterned photoresist layer 210. Precisely speaking, the threshold voltage implantation process P1 is performed through the gate dielectric layers 111, 151, 191 to implant a dopant in a proper conductive type, such as a first conductive type dopant, for adjusting the threshold voltages of channels within the gate structures 110, 150, 190. For example, if NMOS transistors are requested to be formed in the three transistor regions 110, 150, 190, a P type dopant, preferably IIIA elements including boron (B), boron difluoride (BF2) and indium (In), may be implanted accordingly. On the other hand, if PMOS transistors are requested to be formed in the transistor regions 110, 150, 190, an N type dopant, preferably VA elements including phosphate (P), arsenic (As) and antimony (Sb), may be implanted to adjust the threshold voltage ($V_{th}$) of the channels thereof.

In a preferred embodiment, for NMOS transistors, the threshold voltage implantation process P1 may be performed by implanting a dopant, such as BF2, with a dosage approximate at $5 \times 10^{13}/cm^2$ to $1 \times 10^{14}/cm^2$ at an energy of about 10 KeV; or implanting another dopant, such as In, with a dosage approximate at $5 \times 10^{13}/cm^2$ to $1 \times 10^{14}/cm^2$ at an energy about 135 KeV, but is not limited thereto. In another preferred embodiment, for PMOS transistors, the threshold voltage implantation process P1 may be performed by implanting a dopant, such as As, with a dosage approximate at $1 \times 10^{12}/cm^2$ to $5 \times 10^{13}/cm^2$ at an energy about 80 KeV, or implanting another dopant, such as P.

Figure 3:
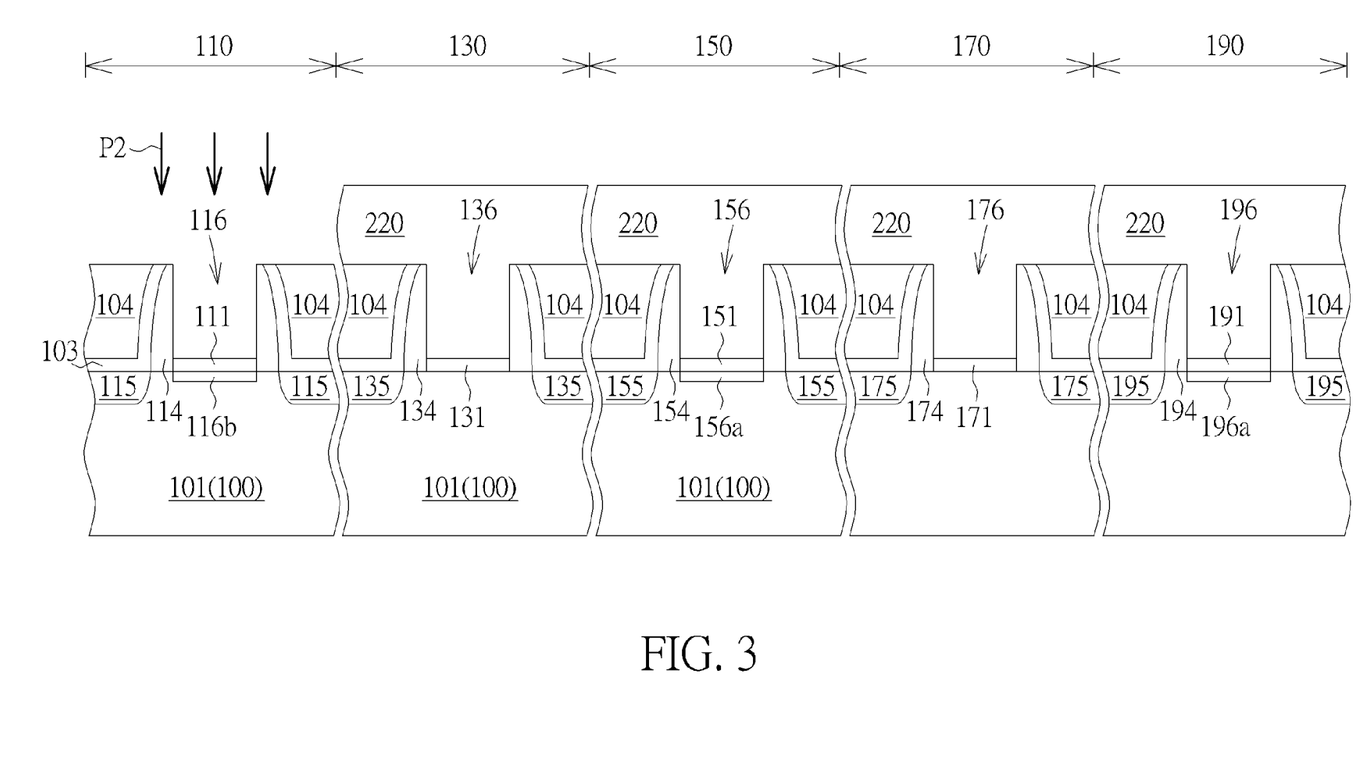
FIG. 3 is a schematic diagram showing a semiconductor device after performing the compensated threshold voltage implantation process.

After removing the patterned photoresist layer 210, another pattern mask layer, such as a patterned photoresist layer 220 is formed, to cover the transistor regions 130, 150, 170, 190, and a compensated threshold voltage implantation process P2 is performed at the only exposed gate trench 116, to form a doped region 116b in the transistor regions 110 through the patterned photoresist layer 220, as shown in FIG. 3. It is worth noting that, the compensated threshold voltage implantation process P2 is performed to implant an opposite dopant, such as a second conductive type dopant which is opposite to the first conductive type, for tuning the threshold voltages thereof to meet the target. In other words, for NMOS transistors, a N type dopant, such as VA elements including P, As and Sb, may be implanted to compensate previously implanted P type dopant in the doped region 116a; and for PMOS transistors an N type dopant, such as IIIA elements including B and In may be implanted to compensate previously implanted N type dopant, accordingly, so as to obtain a lower threshold voltage.

In the preferred embodiment of implanting B, BF2 or In in the threshold voltage implantation process P1, the compensated threshold voltage implantation process P2 may be performed by implanting the opposite dopant, such as P, As or Sb, with a dosage approximate at $1\times10^{12}/cm^2$ to $5\times10^{13}/cm^2$ at an energy of about 80 KeV; and in the preferred embodiment of implanting P or As in the threshold voltage implantation process P1, the compensated threshold voltage implantation process P2 may be performed by implanting the opposite dopant, such as B, BF2 or In, with a dosage approximate at $5\times10^{13}/cm^2$ to $1\times10^{14}/cm^2$ at an energy of about 10 KeV. In this manner, the transistor regions 110 having undergone both of the threshold voltage implantation process P1 and the compensated threshold voltage implantation process P2 may have relatively lower threshold voltage than that of the transistor regions 130, 150, 170, 190 having only undergone the threshold voltage implantation process P1.

Figure 4:
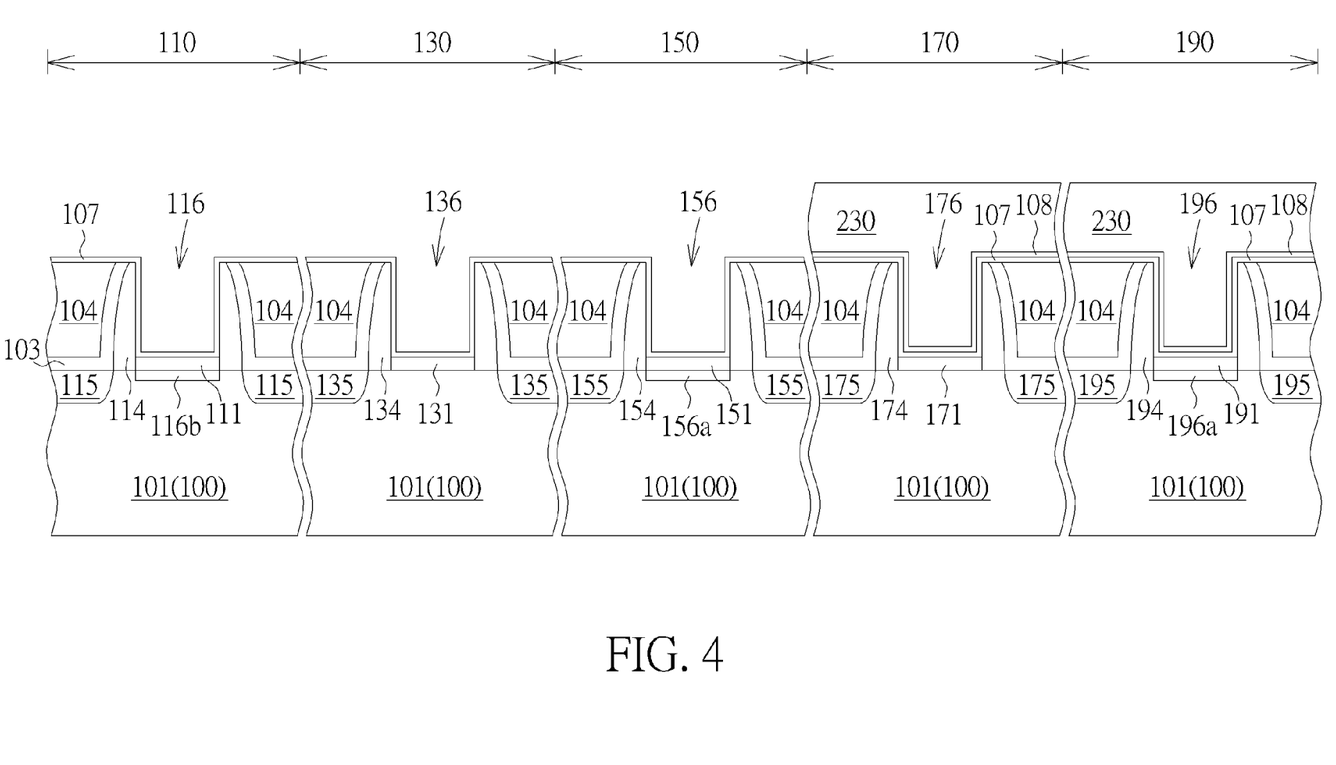
FIG. 4 is a schematic diagram showing a semiconductor device after forming the work function layer.

In the following, after removing the patterned photoresist layer 220, a work function layer 108 is formed only in the transistor regions 170, 190, as shown in FIG. 4. The formation of the work function layer 108 for example includes forming a work function material layer (not shown in the drawings) on the fin shaped structure 101 to cover the transistor regions 110, 130, 150, 170, 190 and to fill in the gate trenches 116, 136, 156, 176, 196, forming a patterned mask, such as a patterned photoresist layer 230, to cover the transistor regions 170,190, and removing the exposed work function material layer within the transistor regions 110, 130, 150 by using the patterned photoresist layer 230 as a mask, to retain the work function material layer formed within the transistor regions 170, 190 thereby. In one embodiment, the work function layer 108 preferably includes material in a proper conductive type, for example for PMOS transistor, a P type work function layer, for example including titanium nitride, or tantalum carbide (TaC), may be formed, but is not limited thereto.

In one embodiment, the gate dielectric layers 111, 131, 151, 171, 191 may be optionally removed before the work function material layer is formed, and a U-shaped dielectric layer (not shown in the drawings), for example including dielectric materials having dielectric constants (k value) larger than 4, such as hafnium oxide ($HfO_2$), may be formed in the gate trenches 116, 136, 156, 176, 196, but is not limited thereto. Also, in another embodiment, a barrier layer 107, for example including titanium (Ti), tantalum (Ta), titanium nitride (TiN) or tantalum nitride (TaN), may be optionally formed also before the work function material layer is formed, wherein the barrier layer 107 is formed in the transistor regions 110, 130, 150, 170, 190 to cover the fin shaped structure 101 and to fill in the gate trenches 116, 136, 156, 176, 196 as shown in FIG. 4.

Figure 5:
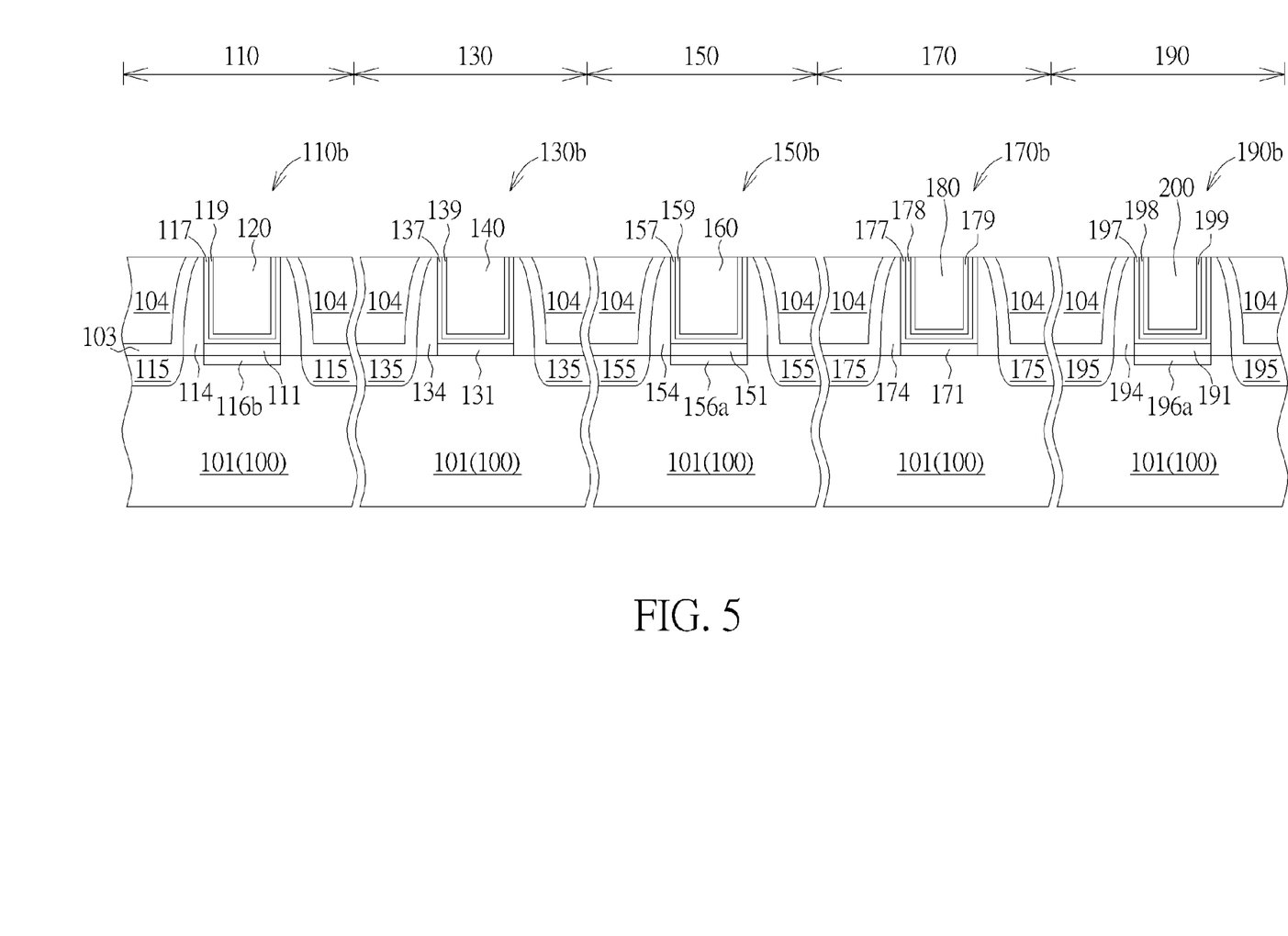

Next, the patterned photoresist layer 230 is removed, and another work function layer (not shown in the drawings) is formed to cover the transistor regions 110, 130, 150, 170, 190 without removing another portion thereof. The detailed materials and formation of the work function layer are all similar to those of the work function layer 108 and will not be further detailed herein. Next, a conductive layer (not shown in the drawings) is formed on the work function layer, and a planarization process is performed to form five metal gate structures 110b, 130b, 150b, 170b, 190b as shown in FIG. 5. Precisely, the metal gate structures 110b, 130b, 150b formed in the transistor regions 110, 130, 150 have barrier layers 117, 137, 157 formed from the barrier layer 107 and work function layers 119, 139, 159 formed subsequently; and the metal gate structures 170b, 190b formed in the transistor regions 170, 190 may have barrier layers 177, 197 formed from the barrier layer 107, work function layers 178, 198 formed from the work function layer 108, and work function layers 179, 199 formed subsequently.

Accordingly, channels under the gate structures 110b, 130b, 150b, 170b, 190b may obtain different threshold voltages. For example, if those channels are all for NMOS, the channels of the gate structures 170b, 190b may obtain relatively higher threshold voltages than that of the gate structures 110b, 130b, 150b, due to having relative thicker work function layers (including work function layers 178, 188 and work function layers 179, 199); and the channel under the gate structure 190a may obtain the highest threshold voltage among other gate structures 110b, 130b, 150b, 170b, because the threshold voltage thereof has been further adjusted through the threshold voltage implantation process P1. Likewise, the channel under the gate structure 150a may obtain relatively higher threshold voltage than that of the gate structures 110b, 130b, since the threshold voltage thereof also has been further adjusted through the threshold voltage implantation process P1. Also, it is worth mentioning that, although being adjusted also in the threshold voltage implantation process P1, the threshold voltage of the channel of the gate structure 110b has been further tuned in the compensated threshold voltage implantation process P2, and the lowest threshold voltage among other gate structures 130b, 150b is obtained thereby.

Through the aforementioned steps, the semiconductor device according to the first preferred embodiment of the present invention is obtained, and which includes five different transistors with the same conductive type but in different threshold voltages. In the forming method of the present embodiment, the threshold voltage implantation process and the work function metal forming process are performed in different transistor regions, so as to tune different threshold targets in each transistor region. Additionally, in the present embodiment, the compensated threshold voltage implantation process is performed to lower the threshold target. Thus, the metal gate structures obtained in the present invention are easy to meet the target threshold voltages.

People who are skilled in the art shall realize the method of forming the semiconductor device in the present invention is not limited to the aforementioned steps, and may also include other processes. The following description will detail the different embodiments of the forming method of a semiconductor device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
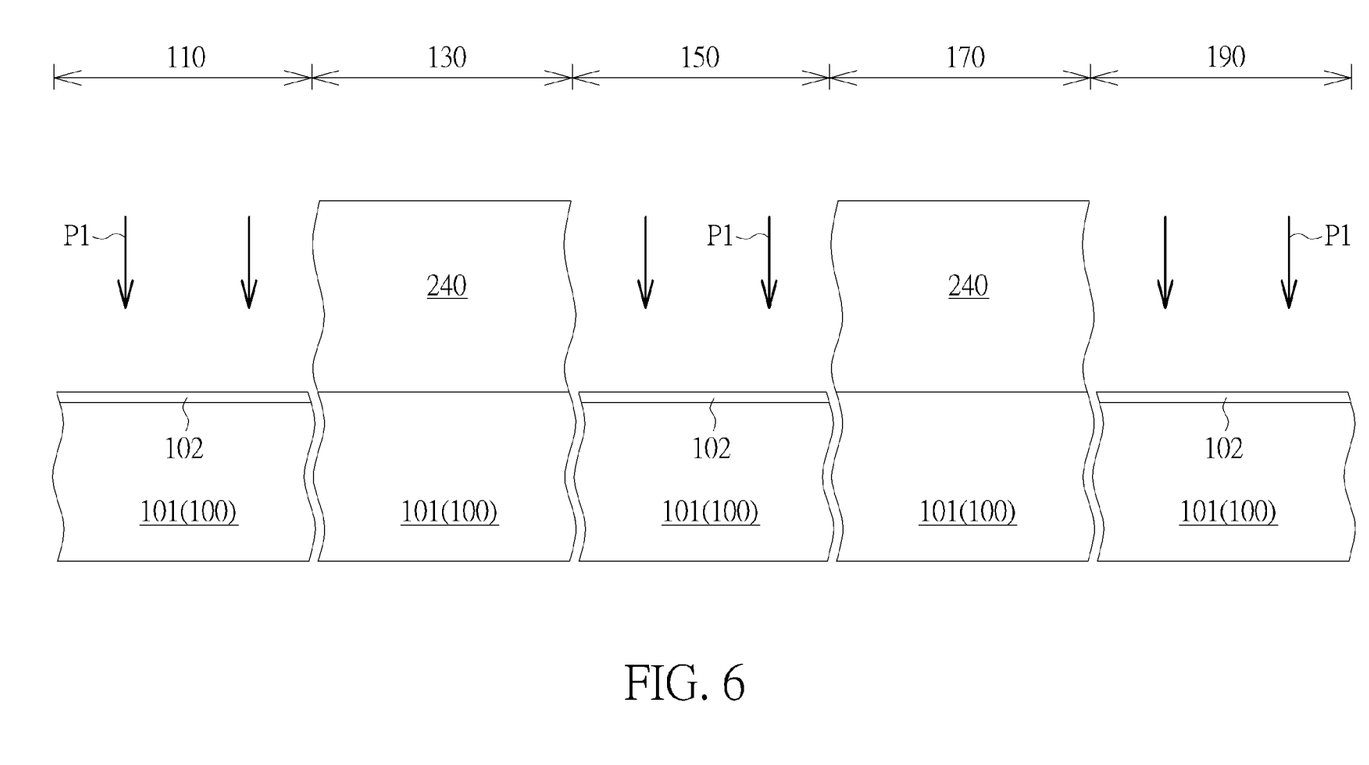
FIG. 6 is a schematic diagram showing a semiconductor device at the beginning of the forming process.
Figure 7:
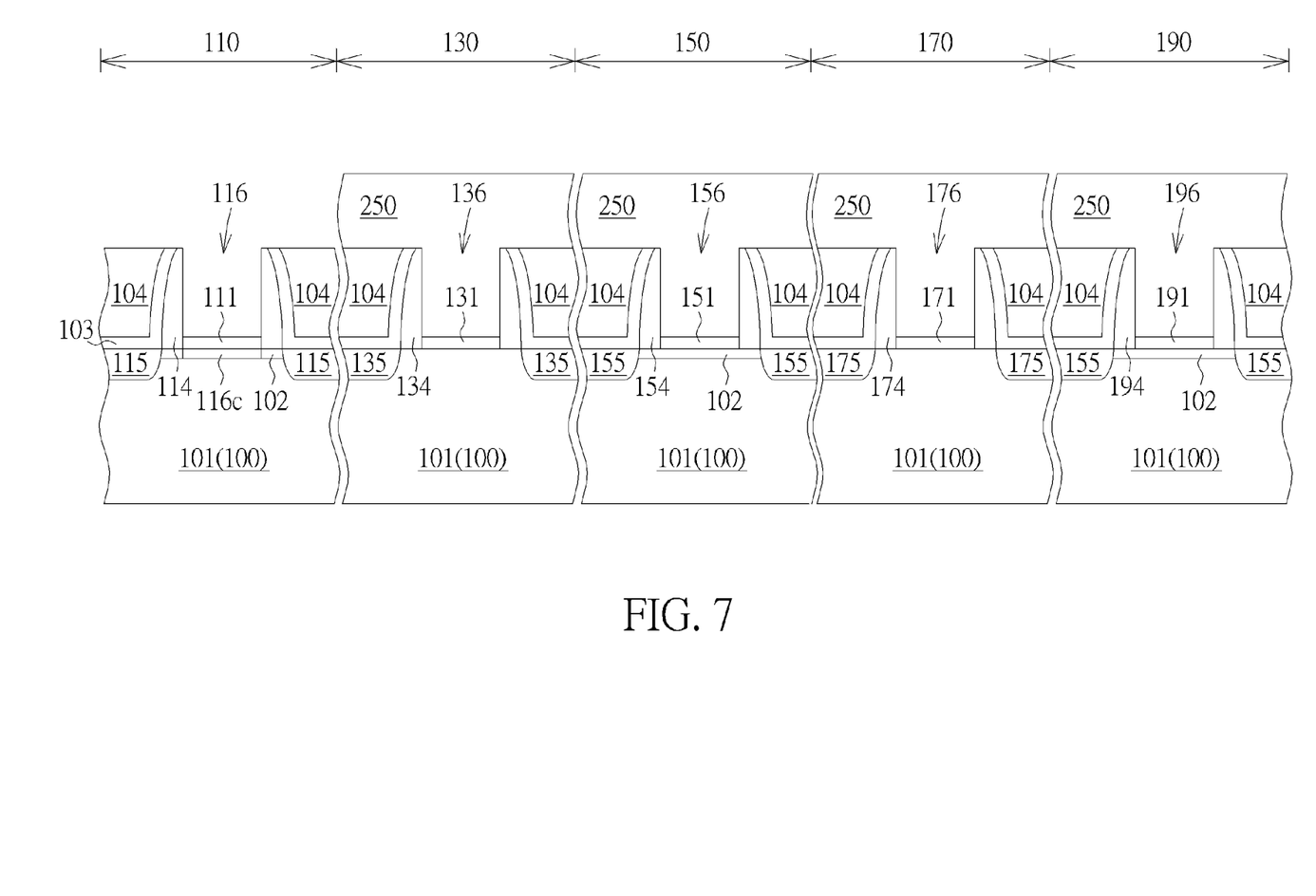
FIG. 7 is a schematic diagram showing a semiconductor device after performing the compensated threshold voltage implantation process.
Figure 8:
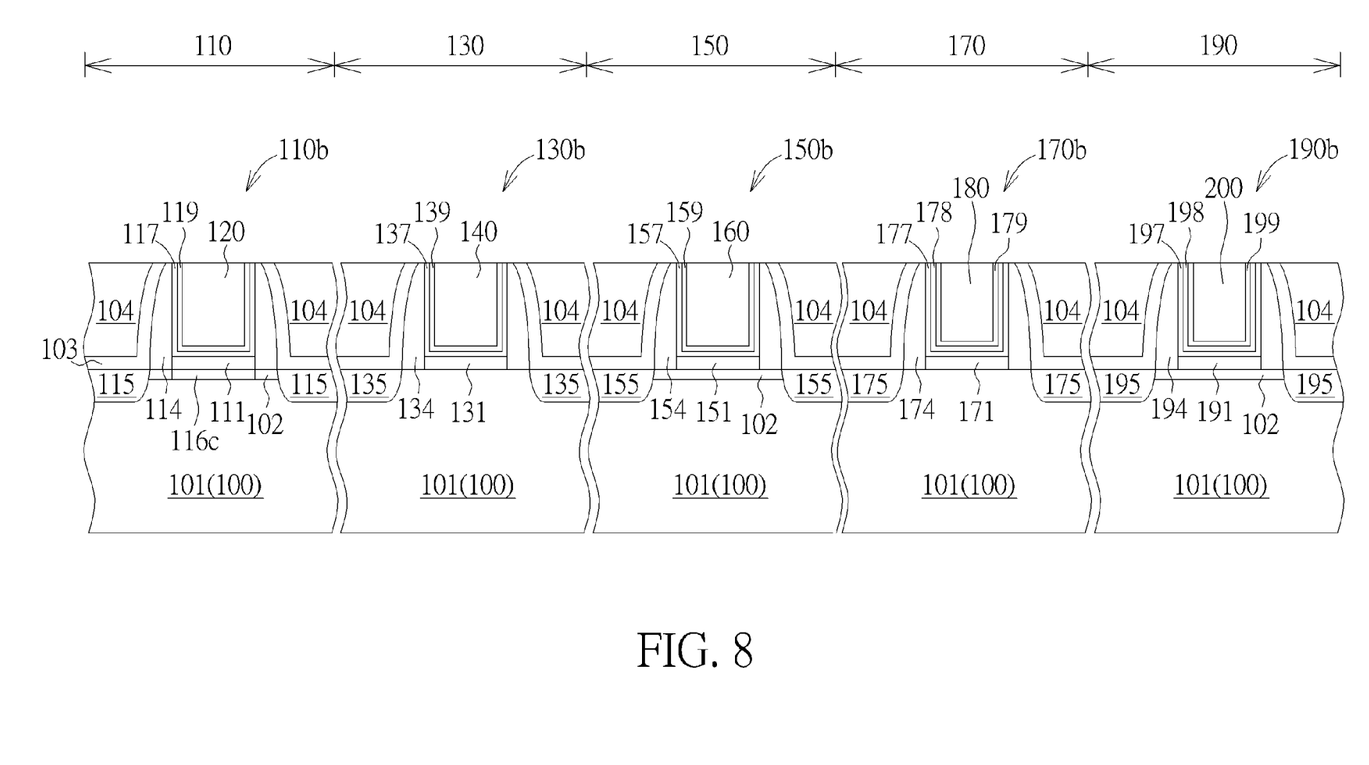

Refers to FIG. 6 to FIG. 8, which are schematic diagrams illustrating a method of forming a semiconductor device according to the second preferred embodiment of the present invention. The formal steps in the present embodiment are substantially similar to those shown in the first preferred embodiment, including forming five transistor regions 110, 130, 150, 170, 190 having the same conductive type, such as P type, on the substrate 100.

As shown in FIG. 6, the differences between the present embodiment and the aforementioned first preferred embodiment are that, the threshold voltage implantation process P1 is performed before the gate dielectric layers 111, 131, 151,

171, 191 are formed. Precisely, a patterned mask, such as a patterned photoresist layer 240, may be formed, to cover the transistor regions 130 and 170, and then, the threshold voltage implantation process P1 is performed on the substrate 100, within the exposed transistor regions 110, 150, 170, to form doped regions 102 respectively through the patterned photoresist layer 240. However, in another embodiment, the threshold voltage implantation process P1 may also be performed after entirely forming an interfacial layer (not shown in the drawings) on the substrate 100 (fin shaped structures 101), so that, the threshold voltage implantation process P1 may be performed through the interfacial layer, and the interfacial layer may be subsequently removed after the threshold voltage implantation process P1, but is not limited thereto. It is noted that, except for the aforementioned difference, other detailed features of the threshold voltage implantation process P1 in the present embodiment are all similar to those in the aforementioned first preferred embodiment and may not be further detailed therein.

Next, after removing the photoresist layer 240, the dummy gate structures 110a, 130a, 150a, 170a, 190a are formed and the metal gate process as shown in FIGS. 1-4 are subsequently carried out, including forming the ILD layer 104 and the CESL 103, and performing the replacement metal gate process to form the gate trenches 116, 136, 156, 176, 196 as shown in FIG. 7. Then, another patterned mask layer, such as a patterned photoresist layer 250, is formed to cover the gate trenches 136, 156, 176, 196 and the compensated threshold voltage implantation process P2 is performed at the only exposed gate trench 116, to form a doped region 116c in the transistor regions 110 through the patterned photoresist layer 250, as shown in FIG. 7. It is noted that, the detailed features of the compensated threshold voltage implantation process P2 in the present embodiment are all similar to those in the aforementioned first preferred embodiment and may not be further detailed therein.

It is also worth noting that, in the present embodiment, since the threshold voltage implantation process P1 and the compensated threshold voltage implantation process P2 are respectively performed either before or after the gate dielectric layer 111 (and/or the gate trench 116) is formed, the doped region 116c, including opposite dopant to compensate previously implanted dopant in the doped region 102, is formed completely within the doped region 102, as shown in FIG. 7.

Following these, U-shaped barrier layers 117, 137, 157, 177, 197, U-shaped work function layers 119, 139, 159, 179, 199 178, 198, are formed and stacked in the gate trenches 116, 136, 156, 176, 196, respectively. Then, the conductive layers 120, 140, 160, 180, 200 are filled in the gate trenches 116, 136, 156, 176, 196 respectively. The formations of the aforementioned U-shaped barrier layers 117, 137, 157, 177, 197, the U-shaped work function layers 119, 139, 159, 179, 199, 178, 198, and the conductive layers 120, 140, 160, 180, 200 are substantially similar to those of the aforementioned first preferred embodiment and may not be further detailed hereafter.

Through the aforementioned steps, the semiconductor device according to the second preferred embodiment of the present invention is obtained, and which also includes five different transistors with the same conductive type but in different threshold voltages. In the forming method of the present embodiment, the threshold voltage implantation process and the compensated threshold voltage implantation process are respectively performed either before or after the gate dielectric layer is formed. In this manner, a doped region having an opposite dopant material is formed within the doped region having proper doped material for adjusting the threshold voltage of the transistor, so as to lower the threshold target. Thus, the metal gate structures obtained in the present invention are easy to meet the target threshold voltages.

Figure 9:
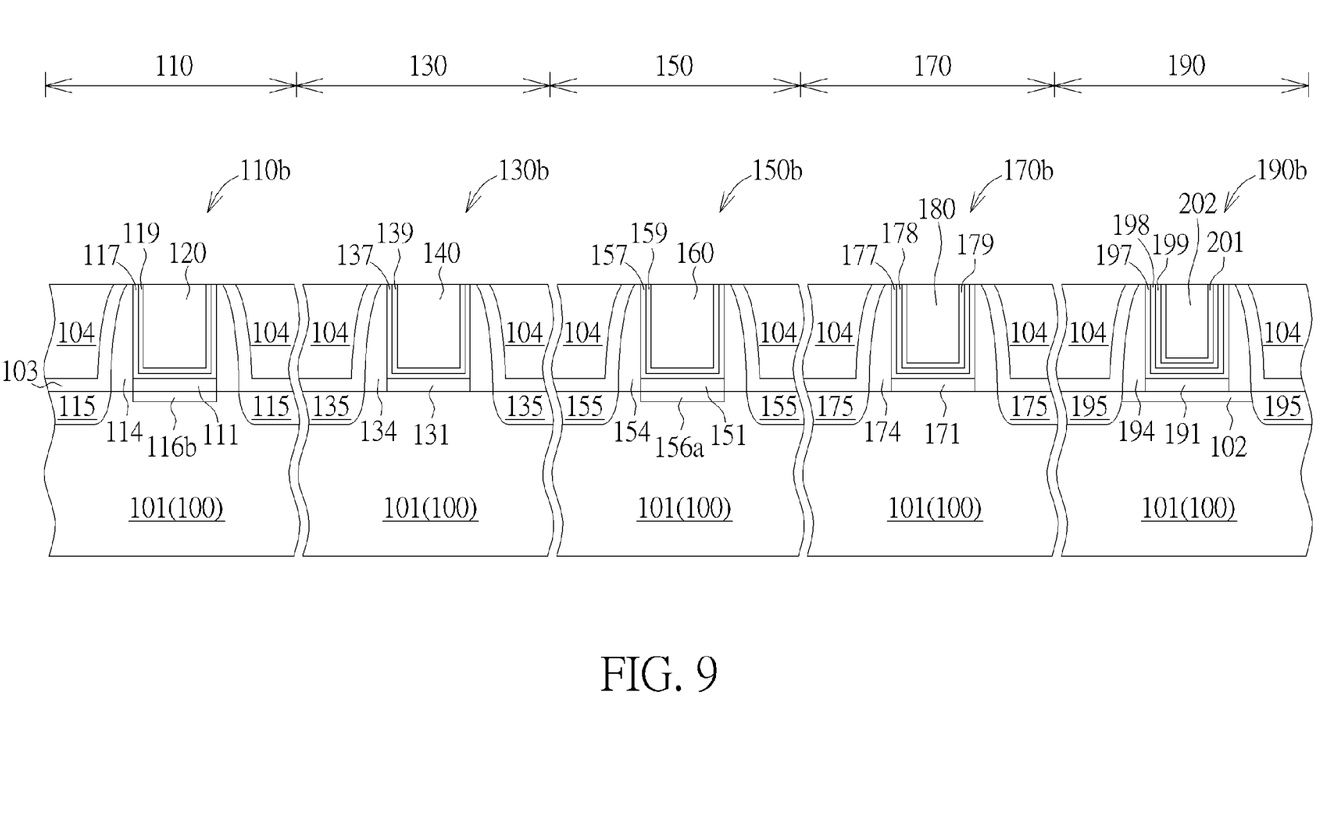
FIG. 9 is a schematic diagram illustrating a method of forming a semiconductor device according to a third preferred embodiment of the present invention.

As shown in FIG. 9, which is a schematic diagram illustrating a method of forming a semiconductor device according to the second preferred embodiment of the present invention. The formal steps in the present embodiment are substantially similar to those shown in FIGS. 1-4 of the first preferred embodiment, including forming five transistor regions 110, 130, 150, 170, 190 having the same conductive type, such as N type, on the substrate 100.

The differences between the present embodiment and the aforementioned first preferred embodiment are that, different arranged work function layers may be further formed in a particular transistor region, for example, additionally forming another U-shaped work function layer 201 in the gate trench 196, as shown in FIG. 9, wherein the material of the U-shaped work function layer 201 may be the same or different from that of the work function layer 108. Through this manner, the metal gate structure 190b formed in the transistor regions 190 may include the barrier layer 197, stacked work function layers 198, 199, 201 and the conductive layer 202, and the channel thereof may obtain a relatively higher threshold voltage thereby.

It is noted that, in the forming method of the present embodiment, work function layers in different thickness or in different materials are respectively formed in different transistor regions, for further adjusting the threshold voltage of the transistor. Thus, the metal gate structures obtained in the present invention are easy to meet the target threshold voltages. Also, in another embodiment, an additional threshold voltage implantation process (not shown in the drawings) may also be performed in particular transistor region, for example the transistor region 190, to implant another dopant in the proper conductive type, such as the first conductive type for further enhancing the threshold voltage thereof.

In addition, although the aforementioned embodiments are all exemplified as a "gate-last" process and a "high-k first" process, the forming method of the present invention is not limited thereto and may also be carried out in a "gate-first" process or a "high-k first". Otherwise, a gate structure including a proper work function layer and metal gate may also be formed in another embodiment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   forming a fin shaped structure on a substrate;
   forming a plurality of gate structures across the fin shaped structure;
   forming a dielectric layer on the substrate, covering the gate structures;
   removing gate electrodes of the gate structures, to form a first gate trench, a second gate trench, a third gate trench and a fourth gate trench;
   performing a first threshold voltage implantation process in the first gate trench, to implant a first dopant in a first conductive type;

performing a compensated threshold voltage implantation process in the first gate trench, to implant a second dopant in a second conductive type, wherein the second conductive type is opposite to the first conductive type;

forming a first work function layer in the fourth gate trench;

forming a second work function layer in the first gate trench, the second gate trench and the third gate trench, and on the first work function layer in the fourth gate trench, wherein the first work function layer and the second work function layer have a same conductive type;

forming a fifth gate trench while removing the gate electrodes of the gate structures;

forming the first work function layer in the fifth gate trench; and performing a second threshold voltage implantation process in the fifth gate trench, to implant a third dopant in the first conductive type.

2. The method of forming a semiconductor device according to claim 1, wherein the first dopant comprises IIIA elements.

3. The method of forming a semiconductor device according to claim 2, wherein the second dopant comprises VA elements.

4. The method of forming a semiconductor device according to claim 1, wherein the first dopant comprises VA elements.

5. The method of forming a semiconductor device according to claim 4, wherein the second dopant comprises IIIA elements.

6. The method of forming a semiconductor device according to claim 1, wherein the first dopant comprises $BF_2$ and the second dopant comprises P.

7. The method of forming a semiconductor device according to claim 1, wherein the first dopant comprises $BF_2$ and the second dopant comprises As.

8. The method of forming a semiconductor device according to claim 1, wherein the first threshold voltage implantation process is performed before gate dielectric layers of the gate structures are formed.

9. The method of forming a semiconductor device according to claim 1, wherein the first threshold voltage implantation process is performed after gate dielectric layers of the gate structures are formed.

10. The method of forming a semiconductor device according to claim 1, wherein while performing the first threshold voltage implantation process, the first dopant is also implanted in the third gate trench.

11. The method of forming a semiconductor device according to claim 1, further comprising:
 forming a shallow trench isolation surrounded the fin shaped structure.

12. The method of forming a semiconductor device according to claim 1, further comprising:
 forming a barrier layer in the first gate trench, the second gate trench, the third gate trench and the fourth gate trench; and
 forming a conductive layer filled in the first gate trench, the second gate trench, the third gate trench and the fourth gate trench.

* * * * *

UNITED STATES PATENT AND TRADEMARK OFFICE
CERTIFICATE OF CORRECTION

PATENT NO. : 9,590,072 B1  
APPLICATION NO. : 14/990806  
DATED : March 7, 2017  
INVENTOR(S) : Chou et al.

It is certified that error appears in the above-identified patent and that said Letters Patent is hereby corrected as shown below:

On the Title Page

Item (72), add the 2nd and the 3rd inventors:  
--Ting-Yao Lin, Taichung (TW);  
Kun-Hsien Lee, Tainan (TW)--.

Signed and Sealed this  
Twenty-sixth Day of December, 2017

Joseph Matal  
*Performing the Functions and Duties of the*  
*Under Secretary of Commerce for Intellectual Property and*  
*Director of the United States Patent and Trademark Office*